US009887318B2

(12) United States Patent
Titov et al.

(10) Patent No.: US 9,887,318 B2
(45) Date of Patent: Feb. 6, 2018

(54) QUANTUM DOT FOR EMITTING LIGHT AND METHOD FOR SYNTHESIZING SAME

(71) Applicant: NanoPhotonica, Inc., Orlando, FL (US)

(72) Inventors: Alexandre Titov, Gainesville, FL (US); Lei Qian, Gainesville, FL (US); Ying Zheng, Gainesville, FL (US); Jake Hyvonen, Gainesville, FL (US); Yixing Yang, Gainesville, FL (US)

(73) Assignee: Nanophotonica, Orlando, FL (US)

( * ) Notice: Subject to any disclaimer, the term of this patent is extended or adjusted under 35 U.S.C. 154(b) by 0 days.

(21) Appl. No.: 15/029,950

(22) PCT Filed: Oct. 16, 2014

(86) PCT No.: PCT/US2014/060866
§ 371 (c)(1),
(2) Date: Apr. 15, 2016

(87) PCT Pub. No.: WO2015/057944
PCT Pub. Date: Apr. 23, 2015

(65) Prior Publication Data
US 2016/0233378 A1 Aug. 11, 2016

Related U.S. Application Data

(60) Provisional application No. 61/891,987, filed on Oct. 17, 2013.

(51) Int. Cl.
*H01L 29/06* (2006.01)
*H01L 33/06* (2010.01)
(Continued)

(52) U.S. Cl.
CPC .......... *H01L 33/06* (2013.01); *H01L 33/0029* (2013.01); *H01L 33/28* (2013.01);
(Continued)

(58) Field of Classification Search
CPC ......... H01L 33/06; H01L 33/10; H01L 33/28; H01L 33/0029
(Continued)

(56) References Cited

U.S. PATENT DOCUMENTS 6,322,901 B1 * 11/2001 Bawendi ................. C01B 17/20
257/E33.004
6,576,291 B2 * 6/2003 Bawendi ................ B82Y 30/00
427/215

(Continued)

FOREIGN PATENT DOCUMENTS

JP 2010-219551 A 9/2010
KR 10-2012-0009686 A 2/2012
(Continued)

OTHER PUBLICATIONS

International Search Report and Written Opinion for Application No. PCT/US2014/060866 dated Jan. 15, 2015.
(Continued)

*Primary Examiner* — Brook Kebede
(74) *Attorney, Agent, or Firm* — Wolf, Greenfield & Sacks, P.C.

(57) ABSTRACT

A quantum dot for emitting light under electrical stimulation has a center of a first composition and a surface of a second composition. The second composition is different than the first composition. An intermediate region extends between the center and surface and has a continuous composition gradient between the center and the surface. The quantum dot is synthesized in a one pot method by controlling the rate and extent of a reaction by controlling the following parameters: (i) type and quantity of reactant, (ii) reaction time, and (iii) reaction temperature.

19 Claims, 7 Drawing Sheets

(51) Int. Cl.
*H01L 33/28* (2010.01)
*H05B 33/10* (2006.01)
*H01L 33/00* (2010.01)
*B82Y 30/00* (2011.01)

(52) U.S. Cl.
CPC .............. *H05B 33/10* (2013.01); *B82Y 30/00* (2013.01); *H01L 2933/0033* (2013.01)

(58) Field of Classification Search
USPC .................. 257/13, 89, 98, 103; 977/950
See application file for complete search history.

(56) References Cited

U.S. PATENT DOCUMENTS

| | | |
|---|---|---|
| 2008/0182105 A1 | 7/2008 | Wang et al. |
| 2009/0109435 A1 | 4/2009 | Kahen et al. |
| 2009/0278141 A1* | 11/2009 | Coe-Sullivan ......... B82Y 20/00 257/89 |
| 2010/0140586 A1 | 6/2010 | Char et al. |
| 2012/0138894 A1* | 6/2012 | Qian ..................... H01L 51/502 257/13 |
| 2012/0195340 A1 | 8/2012 | Cheon et al. |
| 2013/0069036 A1 | 3/2013 | Miyata et al. |
| 2013/0099212 A1 | 4/2013 | Jang et al. |
| 2013/0175558 A1 | 7/2013 | Orsley et al. |
| 2014/0103798 A1 | 4/2014 | Yamanaka et al. |
| 2016/0315217 A1 | 10/2016 | Yang et al. |

FOREIGN PATENT DOCUMENTS

| | | |
|---|---|---|
| KR | 10-2013-0043294 A | 4/2013 |
| WO | WO 2011/088159 A1 | 7/2011 |
| WO | WO 2013/001687 A1 | 1/2013 |
| WO | WO 2013/157495 A1 | 10/2013 |
| WO | WO 2013/171272 A2 | 11/2013 |

OTHER PUBLICATIONS

Extended European Search Report and European Search Opinion dated Mar. 1, 2017 in connection with 14853330.0.

Chin et al., Energy transfer in hybrid quantum dot light-emitting diodes. Journal of Applied Physics. Jul. 7, 2008;104:013108. doi: http://dx.doi.org/10.1063/1.2932149.

Colvin et al., Light-emitting diodes made from cadmium selenide nanocrystals and a semiconducting polymer. Nature. Aug. 4, 1994;370:354-7. doi:10.1038/370354a0.

Hikmet et al., Polarized-Light-Emitting Quantum-Rod Diodes. Adv. Mater. Jun. 6, 2005;17(11): 1436-9. doi:10.1002/adma.200401763. Epub May 24, 2005.

Zhang et al., Scalable single-step noninjection synthesis of high-quality core/shell quantum dots with emission tunable from violet to near infrared. ACS Nano. Dec. 12, 2012;6(12):11066-73. doi: 10.1021/nn304765k. Epub Dec. 12, 2012.

International Search Report and Written Opinion for Application No. PCT/US2014/069479 dated Mar. 31, 2015.

Extended European Search Report and Search Opinion for Application No. EP 14870470.3 dated Nov. 3, 2017.

* cited by examiner

US 9,887,318 B2

QUANTUM DOT FOR EMITTING LIGHT AND METHOD FOR SYNTHESIZING SAME

CROSS-REFERENCE TO RELATED APPLICATIONS

This application is the National Phase under 35 U.S.C. § 371 of PCT International Application No. PCT/US2014/060866, filed Oct. 16, 2014, which claims the benefit and priority of U.S. Provisional Application No. 61/891,987, filed Oct. 17, 2013, the entire contents of the aforementioned applications are hereby incorporated herein by reference.

STATEMENT OF RIGHTS TO INVENTIONS MADE UNDER FEDERALLY SPONSORED RESEARCH

This invention was made with Government support under SBIR Grant 1353411 awarded by the National Science Foundation. The Government has certain rights to this invention.

BACKGROUND OF THE INVENTION

This invention is directed to quantum dot light emitting diodes, and in particular, the quantum dot nanoparticles forming the emitting layer of the quantum dot light emitting diode.

Light emitting diodes (LEDs) have become increasingly used both commercially and in the home. Because of their low energy consumption, small size and long lifetime LEDs have become extremely popular as a result of the desire for reducing carbon footprint.

One type of light emitting diode is the quantum dot light emitting diodes (QD-LEDs). Quantum dots (QDs) are semiconductor nanocrystallites having radii approximately equal to or smaller than the bulk exciton Bohr radius of that semiconductor. Quantum confinement of electrons and holes leads to an increase in the band gap of the QDs as the size approaches or becomes less than the Bohr radii. When the band gap increases, the optical absorption of and emission from quantum dots shifts to higher energies as the size of the dots decreases.

As seen in FIG. 1, QD-LEDs are known in the art and employ neat layers and/or composite layers of materials for efficient charge injection, charge transport and charge recombination for radiative emission, as known from PCT/US2010/041208. A QD-LED, generally indicated as 10, may include a layer of Zn0 nanoparticles which function as the electron transport and injection layer 14. A cathode 12, preferably formed of aluminum, injects electrons into the ZnO nanoparticle layer 14. Electrons. pass through the electron transport/injection layer 10 and are then injected from the electron layer 10 into a QD light emitting layer 16. The QDs typically have a core of CdSe and a shell of ZnS. The light emitting layer 16 is supported by a hole injection and transport layer formed as a TFB layer 18 and PEDOT:PSS layer 19. The hole injection and transport layer is in turn supported by an indium tin oxide anode 22 from which holes are injected, which in turn is supported on a solid glass substrate 24. The hole injection and transport layer may also be formed using NiO or MoO$_3$ nanoparticles. Cathode 12 is electrically connected to anode 22 across a voltage source 30. In this way, the QD-LED is excited 8; to emit light through glass substrate 24.

The prior art QD-LED has been satisfactory. However, because of inappropriate compositions and discontinuities in composition in the QDs of the light emitting layer, the known QD-LEDs are not bright, and are inefficient requiring more energy for less luminance at the designed wavelength.

Accordingly, a QD for a QD-LED which overcomes the shortcomings of the prior art is desired.

BRIEF SUMMARY OF THE INVENTION

A light emitting diode having a light emitting layer including quantum dots for emitting light under electrical stimulation includes one or more quantum dots. Each quantum dot has a center of a first composition and a surface of a second composition, the second composition is different than the first composition. An intermediate region extends between the center and the surface, and at all points have a continuously varied composition over the QD radius between the center and surface. In a preferred embodiment for emission of green or red light, the center has a structure $Cd_xZn_{1-x}Se_yS_{1-y}$ where $0<X\le0.5$ and one of $0.5\le Y<1$ and $0\le Y<0.5$, i.e. the center is rich in CdSe; wherein the surface has a structure $Cd_xZn_{1-x}Se_yS_{1-y}$ where $0<X\le0.5$ and $0<Y\le0.5$, i.e. the surface is rich in ZnS; and the structure approximately midway between the center and surface has a structure of $Cd_xZn_{1-x}Se_yS_{1-y}$ where $0<X\le0.5$ and one of $0.5\le Y<1$ and $0\le Y<0.5$, i.e. the intermediate region is rich in ZnSe.

Quantum dot nanoparticles for emitting light under electrical stimulation is formed by first creating a cationic mixed solution having a controlled concentration of a Zinc reactant, a Cadmium reactant and a solvent. The solvent is typically non-coordinating, although coordinating solvents may be used. An anionic precursor solution having a controlled concentration of a Sulfur reactant and a controlled concentration of a Selenium reactant are dissolved into the cationic mixed solution. The rate and extent of reaction between one or more of the reactants is controlled by varying at least one of the variables: reaction time, reaction temperature and type of reactant. The relative amounts of the anionic reactants relative to the cationic reactants are also controlled. The concentration of the Sulfur in the Sulfur reactant is between 0 and 100 percent. The concentration of Selenium in the Selenium reactant is between 0 and 100 percent.

DETAILED DESCRIPTION OF THE PREFERRED EMBODIMENT

Quantum dots for use in the red, green or blue light emitting layer of a light emitting diode in accordance with the invention have a structure with a center having composition $Cd_xZn_{1-x}Se_yS_{1-y}$ where $0<X\leq0.5$ and one of $0.5\leq Y<1$ and $0\leq Y<0.5$; the surface has a composition $Cd_xZn_{1-x}Se_yS_{1-y}$ where $0<X\leq0.5$ and $0<Y\leq0.5$; and the structure approximately midway between the center and surface has a composition of $Cd_xZn_{1-x}Se_yS_{1-y}$ where $0<X\leq0.5$ and one of $0.5\leq Y<1$ and $0\leq Y<0.5$.

Figure 1:
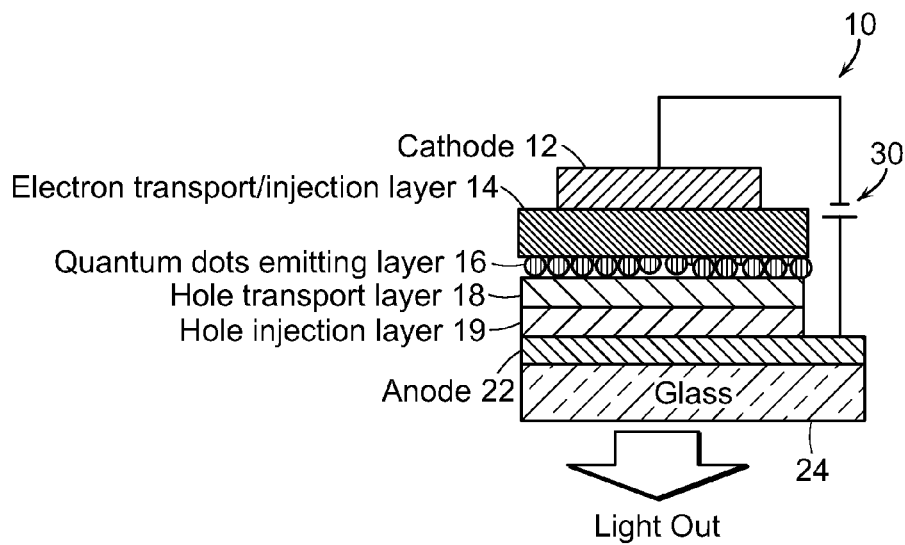
FIG. 1 is a schematic drawing of a QD-LED constructed in accordance with the prior art.
Figure 2:
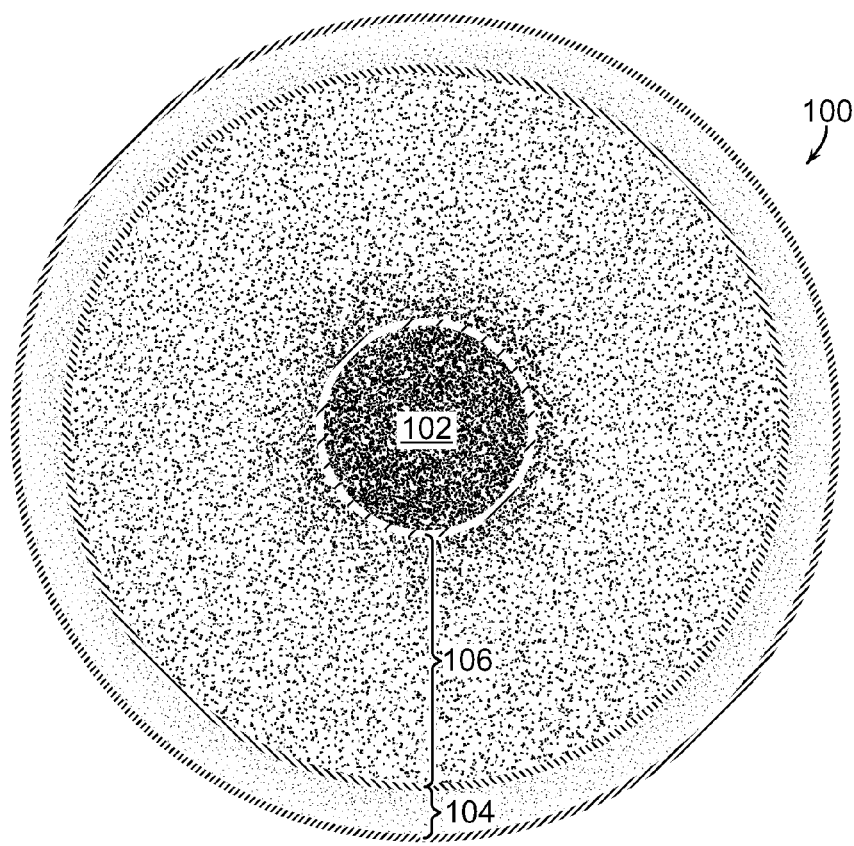
FIG. 2 is a schematic diagram of the gradient composition of a quantum dot nanoparticle formed in accordance with the invention.

As seen in FIG. 2, each quantum dot 100 has a center 102 and a surface 104. An intermediate region 106 extends from the center 102 to the surface 104. The regions near the center and surface, and the intermediate region 104 may themselves be formed of sub-regions. The structure has a continuously varied composition over the radius of the quantum dot from the center to the surface.

The center, intermediate region and surface of an idealized, spherical quantum dot are shown schematically in FIG. 2.

As will be described below, the structure is formed due to the reactivity difference between Cadmium and Zinc as well as between the Selenium and Sulfur precursors. The more reactive Cadmium and Selenium precursors lead to the nucleation of a Cd-rich and Se-rich center 102 first and then the less reactive Zn and Se precursors gradually participate in the formation of the surface 104 and the intermediate regions 106 resulting in continuous chemical composition gradients along the radial direction (through intermediate region 106) of the quantum dot 100.

As a result of the gradient structure, the discrete interfaces between the regions of the prior art are dissipated. The chemical composition gradient structure of the present invention eliminates significant lattice mismatches between the center, surface and intermediate region which gives rise to the interfacial defects and irregular nanoparticle growth, which the inventors believe to be one of the primary reasons for low quantum efficiencies.

The above quantum dot has a structure capable of being adapted and incorporated into the light emitting diode in each of a red, blue and green LEDs. As will be discussed below, in synthesizing the quantum dot by controlling the relative amount of Cadmium, Zinc, Selenium, and Sulfur in each of the center, intermediate region and surface as well as the composition gradient between each, the output characteristics of a light emitting layer formed by the quantum dots can be set to form a light emitting layer for red, blue, or green LEDs. A method of synthesis for each quantum dot is discussed below by color.

Green Quantum Dots

Each of the quantum dots are synthesized utilizing a one pot method. In a one pot method, each of the constituent parts are mixed together and the radial structure is determined by controlling a number of parameters including at least: (i) type of precursor, (ii) the reaction time, (iii) the reaction temperature, and (iv) the reaction atmosphere. In synthesizing a quantum dot for a green LED, a cationic mixed solution is formed from a Zinc reactant, a Cadmium reactant and a solvent. Typically the solvent is non-coordinating, although coordinating solvents may be used as well. In a preferred embodiment, the Cadmium and Zinc each are formed with oleic acid and the non-coordinating solvent is 1-octadecent. This mixed solution forms a cationic solution.

The cationic solution is mixed with a Selenium precursor and a Sulfur precursor. In a preferred embodiment, the Selenium precursor and Sulfur precursor are mixed simultaneously with the cationic mixed solution. The type of precursor, as will be described below. may be changed. For the purpose of this application, the type of precursor means a substance in which Sulfur or Selenium or any other reactant is mixed into to form the precursor. In a preferred, non-limiting, embodiment for the green emitting quantum dot, both the Selenium and Sulfur are dissolved in trioctylphosphine to form the precursor (Se-TOP and S-TOP, respectively). The Selenium and the Sulfur precursor are formed as an anionic precursor and are introduced substantially simultaneously into the cationic mixed solution at a temperature between 290-310° C., with a preferred but non-limiting exemplary temperature of about 300° Centigrade, and reacted for times ranging between 1 and about 500 minutes and a preferred non-limiting interval of about ten minutes in an inert atmosphere such as $N_2$, He, Ne, Ar, Kr or Xe, with a preferred non-limiting ambient being an Argon atmosphere.

As described above, because all of the precursors are mixed substantially simultaneously with the cationic mixed solution, the structural parameters of the quantum dot 100, including the composition of the center, the composition of the surface as well as the thickness and composition of the intermediate region can all be simultaneously controlled by the relative amounts and types of the reactants/precursors.

Generally, the relative amount of the Zinc precursor is in excess of the remaining precursors. The amount of Zinc precursor has a larger effect on the extent and composition gradients of the surface. The relative amounts of Cadmium and Selenium precursors will have a larger effect on the composition and composition gradients at the center. The structure of the intermediate region as it approaches the center is affected by all of the precursor ratios. An excess amount of Cadmium relative to Selenium will create a Cadmium Sulfur rich intermediate region, while a Zinc Selenium-rich intermediate region will form if the amount of Selenium is relatively more than the amount of Cadmium introduced to the mixture. The surface composition is primarily determined by the amount of Sulfur precursor. However, the structure or parameters are not independently controlled by the absolute amount of a single precursor. In a typical embodiment, Zinc is in excess and the Zn/Cd ratio is approximately 20. For an intermediate region that is CdS rich, a typical Cd/Zn ratio is 2.0. For a ZnSe-rich intermediate region composition, the Se/Cd ratio is typically 5.

Use of the above-described synthesis method results in the growth of efficient green quantum dots for QD-LEDs. The emission peak wavelengths of the green quantum dots are tunable from 505 nm to 555 nm. At the same time, the quantum efficiency is maintained near or above 80 percent and the full width half maximum (FWHM) of the electroluminescence peak was less than 40 nm. Quantum dots with emission peaks outside of this range can also be achieved, but with quantum efficiencies between 40% and 80%. Dramatic differences in electroluminescent device performance are obtained when the chemical composition of the green quantum dot varies from CdS-rich intermediate region 106 to a ZnSe-rich intermediate region 106; although both types of green quantum dots show similar optical properties in terms of the photoluminescent quantum efficiencies and the photoluminescence spectra. This illustrates the importance not only of the optical properties but also the electronic properties of the quantum dot in providing high performance QD-LEDs.

Figure 3A:
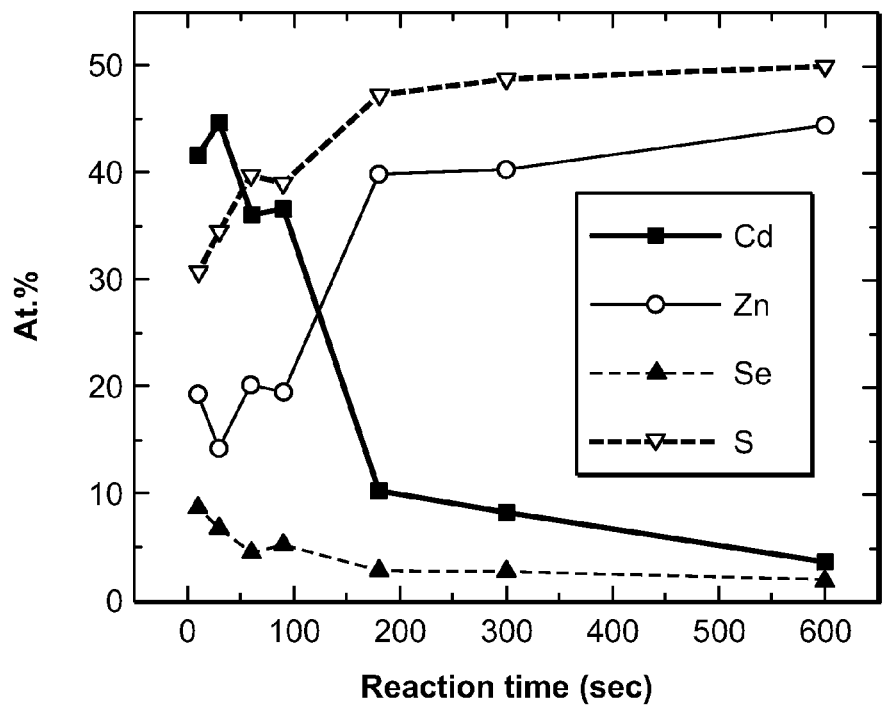
FIG. 3a is a graphical representation of the atomic percentage of reactants as a function of reaction time for quantum dots with a Cd and Sulfur-rich intermediate region synthesized in accordance with the invention.
Figure 3B:
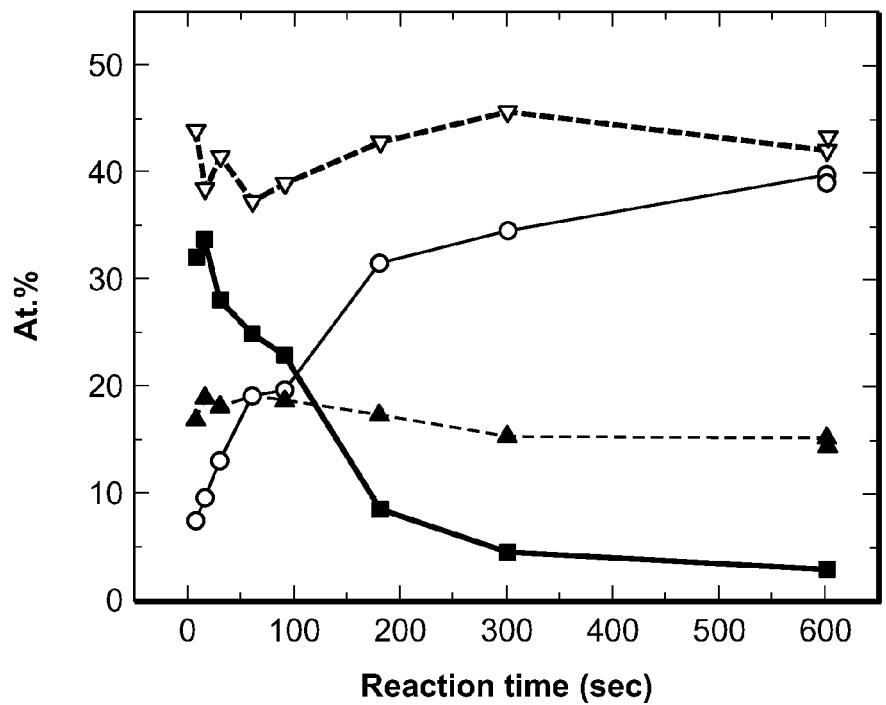
FIG. 3b is a graphical representation of the atomic percentage of reactants as a function of reaction time for quantum dots with a Zn and Selenium-rich intermediate region synthesized in accordance with the invention.

Reference is now made to FIGS. 3a, 3b, where the surface composition of the QDs measured by X-ray photoelectron spectroscopy (XPS) is plotted as a function of reaction time for QDs with either a CdS-rich (FIG. 3a) or a ZnSe-rich (FIG. 3b). intermediate region. For growth times up to 600 seconds at less than 300 degrees Centigrade, the intermediate region forms during the reaction period between a few and 200 seconds. As seen in FIG. 3a for CdS rich intermediate regions, the Se composition was low at <10 at. %. This is because the limited Selenium supply was mostly consumed to form the center while the Zinc and Sulfur components were dominant at the surface 104.

In contrast, as shown in FIG. 3b, the green quantum dots 100 having a ZnSe-rich intermediate region show higher Selenium center concentrations (about 20 at. % during the initial 100 seconds of growth) and gradually exceed the Cadmium composition as the Cadmium is consumed by nucleation and growth of the center 102. This results in the formation of a ZnSe-rich intermediate region 106 with a ZnS-rich surface. The intermediate region of both types of QDs have a composition of $Cd_xZn_{1-x}Se_yS_{1-y}$, where x is larger and y is smaller for a CdS-rich intermediate layer, while x is smaller and y is larger for a ZnSe-rich intermediate region.

Both types of quantum dots have distinct and different morphologies. The average size of quantum dots having a ZnS-rich intermediate region 106 is larger at about 10 nm. In contrast, the ZnSe-rich intermediate region 106 quantum dots have a smaller particle size of about 7 to 8 nm. Because Sulfur amount will primarily determine thickness, the smaller sized quantum dots are thought to result from a thinner ZnS surface, which is critical for balancing charge injection and transport in the quantum dot emitting layer during electroluminescence. For red QDs the S:Zn ratio is about 1:20; for green QDs the S:Zn ratio is about 1:2; and for blue QDs the size ratio is greater than 1:2.

Figure 4:
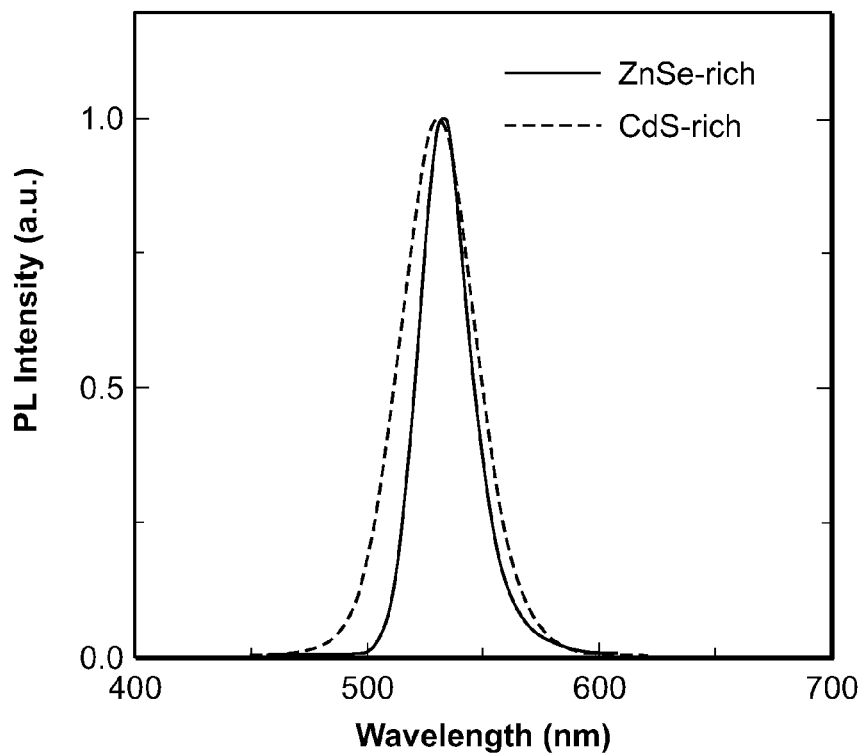
FIG. 4 is a graph of the photoluminescence from green quantum dots with either a CdS-rich or a ZnSe-rich intermediate region synthesized in accordance with the invention.

As seen in FIG. 4, QDs having a CdS or a ZnSe-rich intermediate region have similar photoluminescent spectra, both have emission peaks at about 530 nm for the CdS-rich and about 533 nm for ZnSe-rich quantum dots, i.e., in the green light range. Furthermore, the CdS-rich quantum dots had a larger FWHM of 37 nm compared to the 25 nm FWHM exhibited by the ZnSe-rich quantum dot, while the photoluminescent quantum yield were similar (65% and 70%, respectively).

Figure 5:
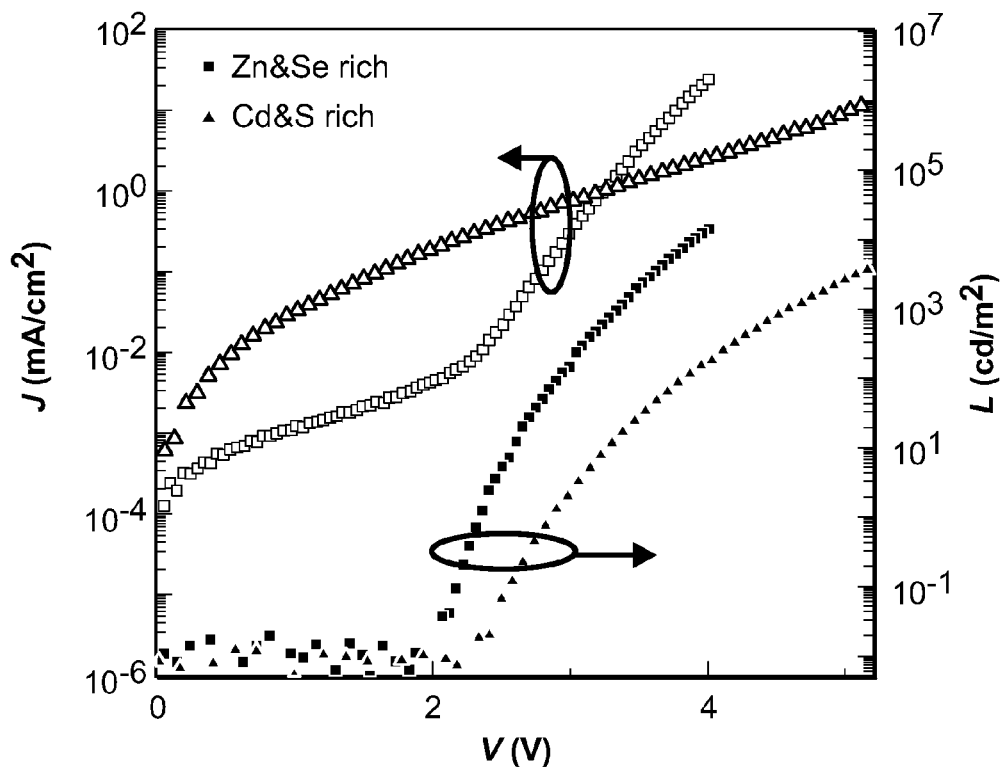
FIG. 5 is a graphical representation of the current density (J) and luminance (L) versus voltage (V) for a QD-LED with green emitting quantum dots synthesized with either a Cd and S-rich or a Zn and Se-rich intermediate layer in accordance with the invention.

As can be seen in FIG. 4, there are only minor differences in the photoluminescent spectra from the CdS-rich and ZnSe-rich intermediate region quantum dots. However, they have very different electroluminescent properties when used as the emitting layer in an LED. As seen in FIG. 5, the current density-luminance-voltage and in FIG. 6 the efficiency characteristics of QD-LEDs utilizing the two distinct types of quantum dots in the emissive layer differ significantly. A quantum dot having a ZnSe-rich intermediate region 106 exhibits lower leakage current with voltages less than 3 volts and a higher forward injection current with a voltage greater than 3 volts when compared to a quantum dot LED with quantum dots that have a CdS-rich intermediate region. In other words, better diode characteristics with smaller leakage currents are obtained from QDs utilizing a ZnSe-rich intermediate region. With a turn-on voltage of about 2 volts, the ZnSe-rich device has a significantly lower operating voltage as compared to the emitting layer made of quantum dots having CdS-rich intermediate region when used for green light emitting diodes.

Figure 6:
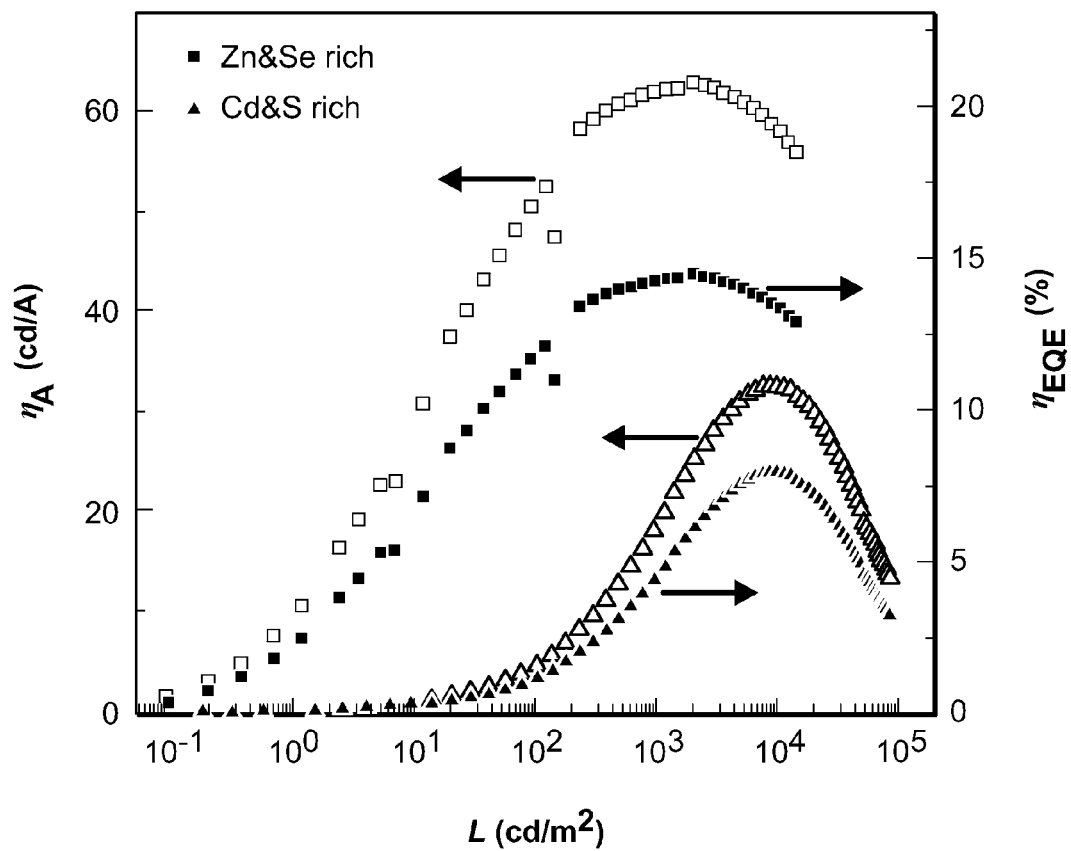
FIG. 6 is a graphical representation of the current efficiency ($\eta_A$) and the external quantum efficiency ($\eta_{EQE}$) versus luminance (L) for a QD-LED with green emitting quantum dots synthesized with either a Cd and S-rich or a Zn and Se-rich intermediate layer in accordance with the invention.

For a green light emitting diode, better efficiencies are measured when the driving voltage is only about 3.3 volts for the ZnSe quantum dot device to generate a luminance of one thousand cd/m². In contrast, to achieve 1000 cd/m², the CdS-rich device requires a driving voltage of about 4.6 volts. It follows, as shown in FIG. 6, that the ZnSe-rich quantum dot device exhibits significant improvement of current efficiency and external quantum efficiencies with a peak current efficiency of 63 cd/A and an external quantum efficiency of 14.4 percent. This is an almost twofold increase as compared to the CdS-rich device which has a peak current efficiency of 33 cd/A and an external quantum efficiency as only 7.9 percent. As can be seen, ZnSe-rich quantum dots result in a QD-LED having a broad, high efficiency over a luminescence range of about 100 to 10,000 cd/m². As a result, QD-LEDs having quantum dots with a ZnSe-rich intermediate region are better suited than the prior art for use in displays.

Table I below compares and summarizes the performance of quantum dots having a ZnSe-rich intermediate regions and quantum dots having a CdS-rich intermediate regions.

TABLE I

| Intermediate Shell of green QDs | $\lambda_{max}$ (nm) | FWHM (nm) | $\eta_{EQE}$ (%) peak | @ 1000 cd/m² | $\eta_P$ (lm/W) peak | @ 1000 cd/m² | $\eta_A$ (cd/A) peak | @ 1000 cd/m² |
|---|---|---|---|---|---|---|---|---|
| CdS-rich | 536 | 40 | 7.9 | 4.5 | 19 | 13 | 33 | 19 |
| ZnSe-rich | 537 | 29 | 14.5 | 14.3 | 60 | 58 | 63 | 62 |

Reduced driving voltage results in significant increases in power efficiency, up to 60 lm/W for the ZnSe-rich device. These results are evidence of the fact that green quantum dots with ZnSe-rich intermediate regions 106 provide better performance than those with CdS-rich intermediate regions, perhaps due to charge injection/transporting properties. This is at least partially explained by the different conduction and valance band energy levels for ZnSe and CdS. The top of the valance band of CdS is at about 6.3 eV, therefore hole injection into an emissive CdS central region is more challenging as compared to the ZnSe which have a valance band level of about 5.9 eV. Furthermore, the growth of a ZnSe-rich intermediate region 106 also may result in a thinner ZnS surface 104 facilitating charge transport within the quantum dot emissive layer. This results in increased efficiency as seen from the figures and the table above.

Red Leds

As discussed above, the composition and the gradient structure may be modified, utilizing the same constituent reactants to provide improved results for use in the light emitting layer of a red quantum dot LED. A one pot synthesis method is utilized to red shift the emitted wavelength of the quantum dots from green to red. Generally for red emission, the amount of Selenium precursor is increased relative to the Sulfur precursor as compared to the relative amounts for the green quantum dots. This can be done preferably by both increasing the absolute amount of Selenium precursor, and reducing the amount of Sulfur precursor.

The primary difference between the one pot method for synthesizing a green quantum dot and a red quantum dot is that the anionic precursors are injected step-wise into the cationic solution. In this way, the first injection of the Selenium precursor primarily controls the properties of the center as well as the intermediate region composition and thickness. The second injection of the Sulfur precursor mainly controls the properties of the surface, creating red quantum dots with more tuneability and control. Utilization of a one pot synthesis allows completion of the growth of the center and surface without intermediate interruptions and no additional purification steps are required, in contrast to a two pot synthesis.

Specifically, the Se precursors is injected as a first step into the mixed cationic solution described above to form the center. A ZnSe-rich intermediate region will also be created in this step. The Sulfur precursor as well as a small amount (about 10% of the original amount of Se precursor) of the Selenium precursor is then introduced into the cationic mixed solution as a second step. The second injection of Selenium creates a continuous composition gradient to reduce the lattice mismatch between the different regions making up the intermediate region. The thickness of the ZnS surface may be adjusted by changing the amount of the Sulfur precursor injected into the cationic mix solution in the second step.

In this methodology, the types of anion precursors are Selenium and Sulfur, each dissolved in a solvent, e.g. trioctylphosphine. Typical conditions for forming Se-TOP precursors are 110° C. for 2 hours under an inert atmosphere.

The resulting composition in all regions of the red-emitting QD_LED is $Cd_xZn_{1-x}Se_yS_{1-y}$ where the center is CdSe-rich, the intermediate region is ZnSe-rich, and the surface of the red quantum dots synthesized as discussed above is ZnS-rich. The composition between the center, intermediate region and surface for quantum dots varies continuously and is accommodated by shallow composition gradients. The average particle size of the quantum dot is about 8 nm. The photoluminescent quantum yield of red quantum dot with this structure, after purification and ligand exchange with octanethiol is about 65 percent.

Figure 7:
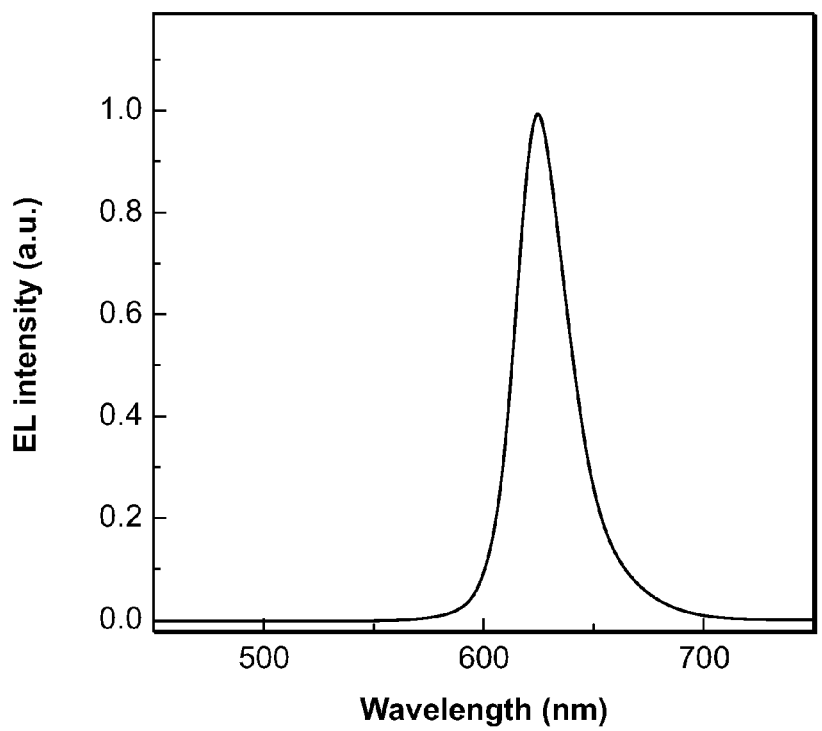
FIG. 7 is a graph of the electroluminescence from a QD-LED with red emitting quantum dots synthesized in accordance with the invention.
Figure 8:
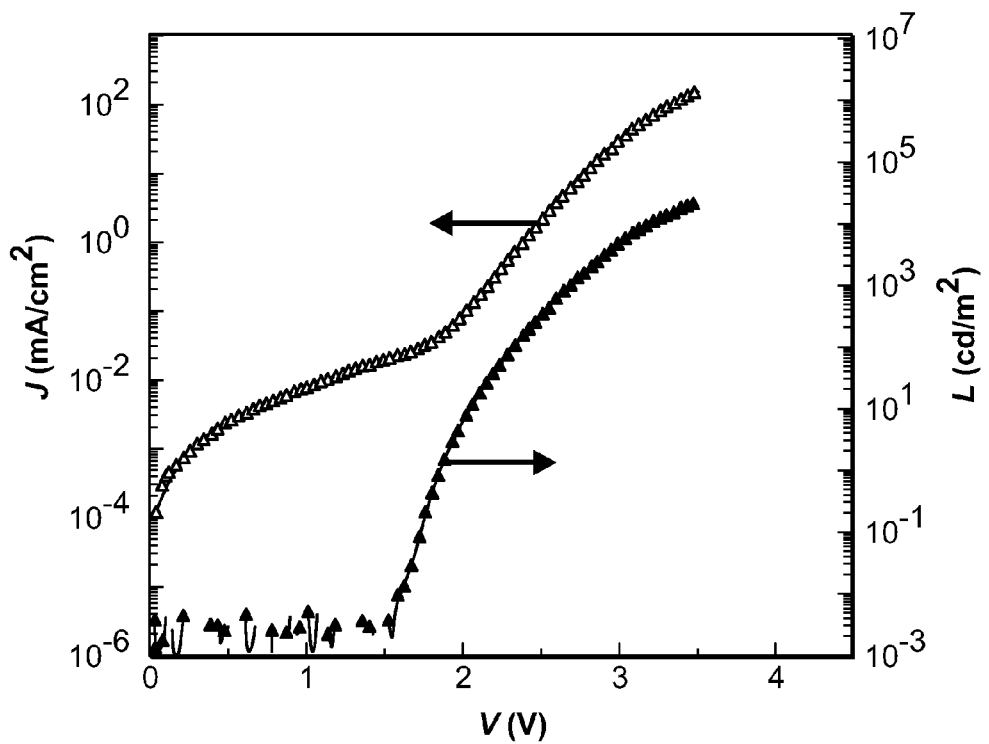
FIG. 8 is a graphical representation of the current density (J) and luminance (L) versus voltage (V) for a QD-LED with red emitting quantum dots synthesized in accordance with the invention.
Figure 9:
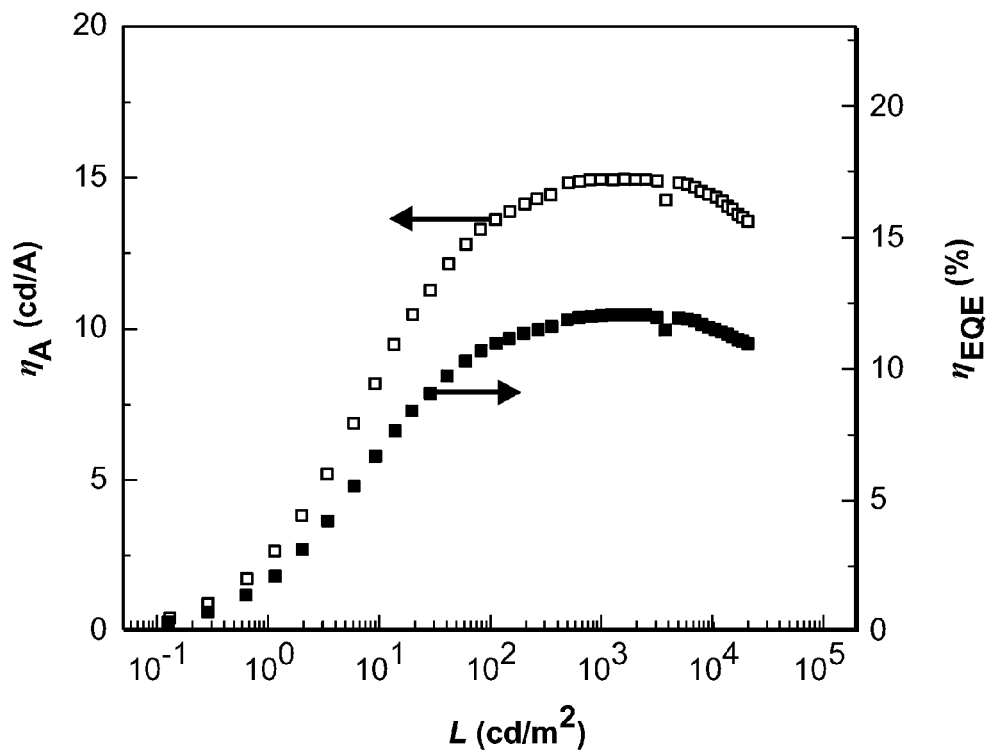
FIG. 9 is a graphical representation of the current efficiency ($\eta_A$) and the external quantum efficiency ($\eta_{EQE}$) versus luminance (L) for a QD-LED with red emitting quantum dots synthesized in accordance with the invention.

Reference is now made to FIGS. 7-9 in which the properties for a red-emitting QD-LED having quantum dots constructed with the gradients described above are provided.

As seen in FIG. 7, the red QD-LED has a narrow emission spectrum with a FWHM of about 25 nm and an emission peak at about 625 nm. The QD-LED also shows a higher current injection and luminance as seen in FIG. 8 with the same driving voltage. The luminance reaches 1000 cd/m$^2$ with a driving voltage of about 2.7 volts. Furthermore, a subthreshold turn-on voltage of about 1.5 volts is observed. This is believed to be a result of interfacial Auger recombination at the hole transfer layer/quantum dot layer interface resulting in hot holes that can cross the interfacial barriers. This results in radiative recombination. As a result, as seen in FIG. 8, the red quantum dots exhibit a high external quantum efficiency of about 12 percent and a current efficiency of about 15 cd/A.

Blue QD-LED

The resulting composition in all regions of the blue-emitting QD_LED is $Cd_xZn_{1-x}Se_yS_{1-y}$ where y is near zero at the center, making the center CdS-rich, the intermediate region is $Cd_xZn_{1-x}S$-rich, and the surface of the blue quantum dots synthesized as discussed above is ZnS-rich. The composition changes between the center to intermediate to surface for quantum dots varies continuously and are accommodated by shallow composition gradients. The composition gradients can be modified to yield two different blue colors (sky blue or deep blue) from the QD-LED. The structure with sky blue color ($\lambda_{max}$~470 nm) may have a higher amount of CdSe in the center. In this embodiment, the amount of Selenium precursor is very small relative to the Sulfur precursor (typically 1 part Se to 400 parts S). Quantum dots with a deep blue emission ($\lambda_{max}$~450 nm) have a $Cd_{1-x}Zn_xS$ center. As a result, the quantum dots form a structure with a $Cd_xZn_{1-x}S$-rich intermediate region and a thick ZnS surface, and the QD emits a deep blue color.

Typically a one pot, two injection synthesis method is utilized. The $Cd_xZn_{1-x}S$ central region is formed by introducing a more reactive Sulfur precursor into the cationic solution. This first injection utilizes, in a preferred but non-limiting embodiment, a Sulfur precursor of the type Sulfur dissolved into one-octadecene typically at 110° C. over times of up to 2 hours. The first injection is done at a temperature of about 310 degrees Centigrade and reacted for about 8 minutes A second injection of a less reactive Sulfur precursor is added to promote the ZnS surface growth. In one preferred non-limiting embodiment, the S precursor is an S-TOP type. Furthermore, the second precursor is reacted at 310° C. for 30 to 40 minutes which allows annealing of the quantum dot. This longer annealing time may reduce the defects within the quantum dot; resulting in higher quantum yields.

The emission wavelength based on this central region can be continuously tuned from deep blue to sky blue, i.e. $\lambda_{max}$ from 430 nm to 490 nm. Photoluminescent quantum efficiencies as high as 80 percent are a necessary but not sufficient condition for QDs that give a deep blue emission at $\lambda_{max}$~450 nm in an efficient QD-LED. A quantum dot having a $Cd_xZn_{1-x}S$ core region is a preferred deep blue emitter.

Figure 10:
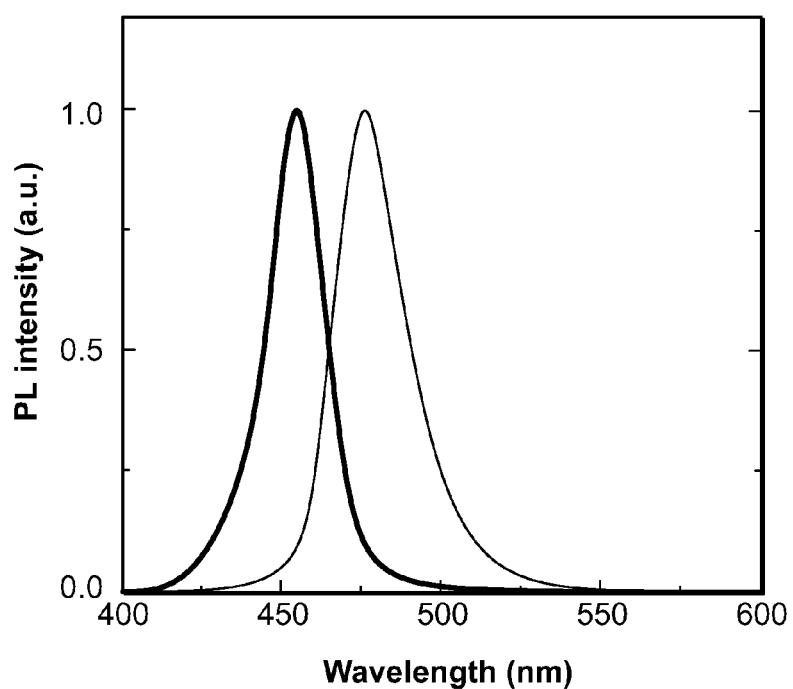
FIG. 10 is a graph of the photoluminescence from deep blue ($\lambda_{max}$~450 nm) and sky blue ($\lambda_{max}$~470 nm) quantum dots synthesized in accordance with the invention.

Quantum dots having CdS-rich intermediate region and relatively thick ZnS surface may lead to a larger particle size of about 12 nm and an irregular shape when used as sky blue quantum dots. In contrast, the $Cd_{1-x}Zn_xS$/ZnS quantum dots have more regular shapes with a particle size of about 8 nm leading to better self assembly of particles. As seen in FIG. 10, the photoluminescent intensity shows maximum values at wavelengths of about 455 and 477 nm respectively, and an FWHM of 20 and 24 nm respectively, for deep blue and sky blue quantum dots, respectively.

For blue quantum dots, the concentration of selenium is very low, estimated to be less than 1%. As a result the center is $Cd_xZn_{1-x}S$ where x approaches one, the intermediate region is $Cd_xZn_{1-x}S$ where x approaches 0.5, and the surface is $Cd_xZn_{1-x}S$ where X approaches zero. The changes in composition are continuous and are accommodated by shallow composition gradients. By changing the composition of the center and the intermediate region, the emitted wavelength can be shifted to the deep blue that is more desirable for display applications.

Figure 11:
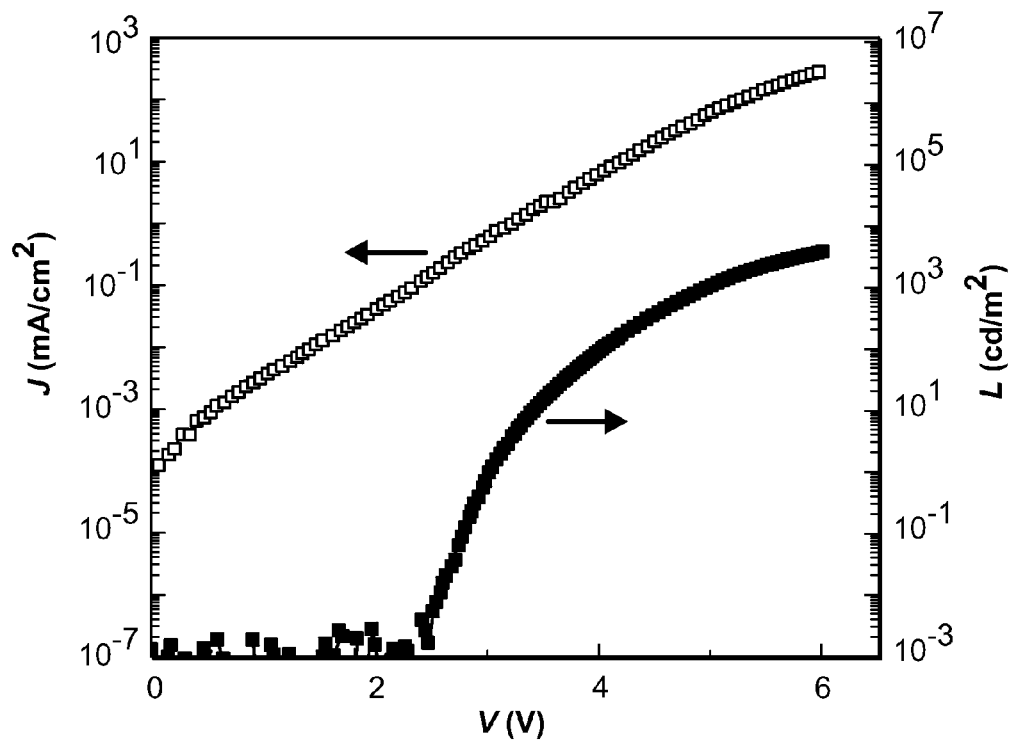
FIG. 11 is a graph showing the current density (J) and luminance (L) versus voltage (V) for a QD-LED with deep blue emitting quantum dots using TFB hole transport layers in accordance with the invention.
Figure 12:
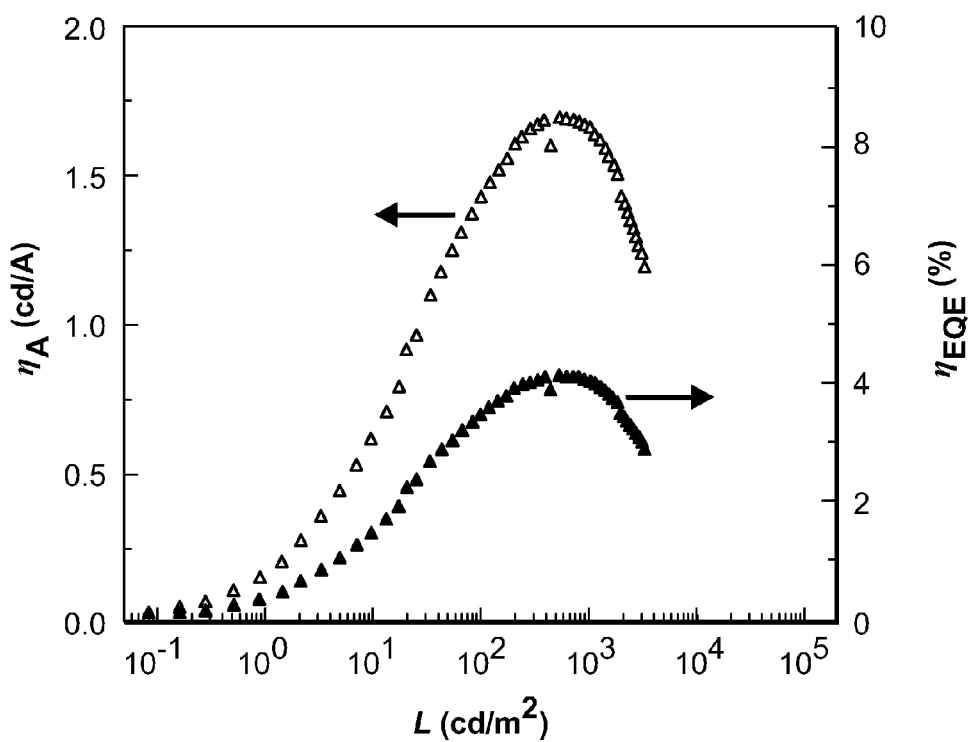
FIG. 12 is a graph showing the current efficiency ($\eta_A$) and the external quantum efficiency ($\eta_{EQE}$) versus luminance (L) for a QD-LED with deep blue emitting quantum dots using TFB hole transport layers in accordance with the invention.

The current density (J) and luminance (L) versus voltage (V) for a QD-LED with deep blue emitting quantum dots using TFB hole transport layers is shown in FIG. 11. The current efficiency ($\eta_A$) and the external quantum efficiency ($\eta_{EQE}$) versus luminance (L) for a QD-LED with deep blue emitting quantum dots using TFB hole transport layers is shown in FIG. 12.

Persons familiar with the state-of-the-art will recognize that material other than TFB can be used to transport holes and inject them into the emissive layer, for example polyvinyl carbazole (PVK) rather than TFB.

As shown by data in Table II below, improved quantum dot LEDs are obtained by utilizing the single pot method, and optimizing the composition of the center, intermediate region and the surface can be tuned to create quantum dots that emit the desired wavelength in a device with a high efficiency and high brightness. Using a continuous change in composition, the shortcomings of the prior art resulting from discontinuities in composition can be avoided.

TABLE II

| Color of QLEDs | λmax (nm) | FHWM (nm) | $\eta_{EQE}$ (%) peak | $\eta_{EQE}$ (%) @ 1000 cd/m² | $\eta_p$ (lm/W) peak | $\eta_p$ (lm/W) @ 1000 cd/m² | $\eta_A$ (cd/A) peak | $\eta_A$ (cd/A) @ 1000 cd/m² |
|---|---|---|---|---|---|---|---|---|
| Deep Blue | 455 | 20 | 10.7 | 10.3 | 2.7 | 2.7 | 4.4 | 4.3 |
| Deep Blue |  |  | 4.1 | 4.0 | 1.2 | 1.0 | 1.7 | 1.6 |
| Green | 537 | 29 | 14.5 | 14.3 | 60 | 58 | 63 | 62 |
| Red | 625 | 25 | 12.0 | 12.0 | 18 | 17.4 | 15 | 15 |

While there have been shown, described and pointed out novel features of the present invention as applied to preferred embodiments thereof, it will be understood that various submissions and substitutions and changes in the form and detail are contemplated to the disclosed invention, which may be made by those skilled in the art without departing from the spirit and scope of the invention. It is the intention therefore, to be limited, only as indicated by the scope of the claims appended hereto. It is also to be understood that the following claims are intended to cover all of the generic and specific features of the invention herein described and all states of the scope of the invention which, as a matter of language, might be said to fall there between.

What is claimed:

1. A method for synthesizing a quantum dot nanoparticle that emits light under electrical stimulation when incorporated into an emitting layer of a quantum dot light emitting diode, comprising the steps of:
    creating a cationic mixed solution having a controlled concentration of a Zinc reactant, a Cadmium reactant and a solvent;
    dissolving an anionic precursor having a controlled concentration of a Sulfur reactant and a controlled concentration of a Selenium reactant into the cationic mixed solution;
    controlling the rate and extent of reaction between at least one of the Selenium reactant and the Sulfur reactant in the cationic mixed solution by varying at least one of the three parameters controlling reaction rate: (i) reaction time, (ii) reaction temperature and (iii) type of reactant; and controlling the relative amounts of the anionic reactants relative to the cationic reactants in an inert ambient,
    wherein the quantum dot nanoparticle comprises:
        a center of a first composition;
        a surface of a second composition, the second composition being different than the first composition; and
        an intermediate region extending between the center and surface having a continuous composition gradient between the center and the surface, and
    wherein:
        the center has a composition $Cd_xZn_{1-x}Se_yS_{1-y}$ where $0<X\le0.5$ and one of $0.5\le Y<1$ and $0\le Y<0.5$;
        the surface has a composition of $Cd_xZn_{1-x}Se_yS_{1-y}$ where $0<X\le0.5$ and $0<Y\le0.5$; and
        the composition approximately midway between the center and the surface has a composition $Cd_xZn_{1-x}Se_yS_{1-y}$ where $0<X\le0.5$ and one of $0.5\le Y<1$ and $0\le Y<0.5$.

2. A quantum dot for emitting light under electrical stimulation comprising:
    a center of a first composition;
    a surface of a second composition, the second composition being different than the first composition; and
    an intermediate region extending between the center and surface having a continuous composition gradient between the center and the surface;
    wherein:
        the center has a composition $Cd_xZn_{1-x}Se_yS_{1-y}$ where $0<X\le0.5$ and one of $0.5\le Y<1$ and $0\le Y<0.5$;
        the surface has a composition $Cd_xZn_{1-x}Se_yS_{1-y}$ where $0<X\le0.5$ and $0<Y\le0.5$; and
        the composition approximately midway between the center and the surface has a composition of $Cd_xZn_{1-x}Se_yS_{1-y}$ where $0<X\le0.5$ and one of $0.5\le Y<1$ and $0\le Y<0.5$.

3. The quantum dot of claim 2, wherein an amount of CdSe in the center is greater than an amount of ZnS in the center and an amount of CdSe in the center is greater than an amount of ZnSe in the center.

4. The quantum dot of claim 2 wherein an amount of ZnS in the surface is greater than an amount of CdSe in the surface.

5. The quantum dot of claim 2, having an internal quantum efficiency of between 40 to 80 percent.

6. The quantum dot of claim 2, wherein
    at least one of the center region, surface region and intermediate region has a greater amount of Selenium than an amount of Cadmium.

7. The quantum dot of claim 2 wherein an amount of Zinc in the quantum dot is greater than an amount of Selenium in the quantum dot.

8. The quantum dot of claim 2, wherein quantum dot has a particle size of about 7 nanometers to 8 nanometers.

9. The quantum dot of claim 2, having an emission peak at a wavelength of about 510 nm to about 540 nm.

10. The quantum dot of claim 2, wherein a peak emission occurs at a wavelength of about 600 nm to 630 nm.

11. The quantum dot of claim 2, wherein the first composition is $Cd_{1-x}Zn_xS$.

12. The quantum dot of claim 2, wherein the center has a greater amount of ZnS than an amount of CdS.

13. The quantum dot of claim 2, wherein the intermediate region has a greater amount of CdS than an amount of ZnS.

14. The quantum dot of claim 2, wherein the quantum dot has a particle size of about 12 nanometers.

15. The quantum dot of claim 2, wherein the quantum dot has a maximum power efficiency over the range of 430 to 490 nanometers.

16. The quantum dot of claim 2, wherein the quantum dot has a peak power efficiency over the range of 420 to 460 nanometers.

17. The quantum dot of claim 2, wherein the internal quantum efficiency is between 70 to 80 percent.

18. A Quantum Dot Light Emitting Diode, having a quantum dot layer, the quantum dot layer comprising a quantum dot comprising:

a center of a first composition;
a surface of a second composition, the second composition being different than the first composition; and
an intermediate region extending between the center and surface having a continuous composition gradient between the center and the surface; wherein:
the center has a composition $Cd_xZn_{1-x}Se_yS_{1-y}$ where $0<X\leq0.5$ and one of $0.5\leq Y<1$ and $0\leq Y<0.5$;
the surface has a composition $Cd_xZn_{1-x}Se_yS_{1-y}$ where $0<X\leq0.5$ and $0<Y\leq0.5$; and
the composition approximately midway between the center and the surface has a composition of $Cd_xZn_{1-x}Se_yS_{1-y}$ where $0<X\leq0.5$ and one of $0.5\leq Y<1$ and $0\leq Y<0.5$.

19. The Quantum Dot Light Emitting Diode of claim 18, wherein an amount of CdSe in the center is greater than an amount of ZnS in the center and an amount of CdSe in the center is greater than an amount of ZnSe in the center.

* * * * *